(12) United States Patent
Pellizzer et al.

(10) Patent No.: US 7,875,513 B2
(45) Date of Patent: Jan. 25, 2011

(54) SELF-ALIGNED BIPOLAR JUNCTION TRANSISTORS

(76) Inventors: Fabio Pellizzer, Via Peroz, 16, 31051 Follina (IT); Roberto Bez, Via C. Olivetti, 2, 20041 Agrate Brianza (IT); Paola Zuliani, Via C. Olivetti, 2, 20041 Agrate Brianza (IT); Augusto Benvenuti, Via C. Olivetti, 2, 20041 Agrate Brianza (IT)

( * ) Notice: Subject to any disclaimer, the term of this patent is extended or adjusted under 35 U.S.C. 154(b) by 4 days.

(21) Appl. No.: 11/411,311

(22) Filed: Apr. 26, 2006

(65) Prior Publication Data

US 2007/0254446 A1 Nov. 1, 2007

(51) Int. Cl.
*H01L 21/82338* (2006.01)
(52) U.S. Cl. ............... 438/202; 438/204; 438/205; 257/E27.046
(58) Field of Classification Search .......... 438/3, 438/309–330, 199, 202–205; 257/E27.046
See application file for complete search history.

(56) References Cited

U.S. PATENT DOCUMENTS

| | | | | |
|---|---|---|---|---|
| 3,793,088 A | * | 2/1974 | Eckton, Jr. ............. | 438/322 |
| 5,091,321 A | * | 2/1992 | Huie et al. ............ | 438/234 |
| 5,959,334 A | * | 9/1999 | Maki et al. ........... | 257/378 |
| 5,973,384 A | * | 10/1999 | Ikegami ............... | 257/588 |
| 6,030,864 A | * | 2/2000 | Appel et al. ........... | 438/234 |
| 6,576,921 B2 | * | 6/2003 | Lowrey ................ | 257/42 |
| 2004/0051094 A1 | * | 3/2004 | Ooishi ................. | 257/5 |
| 2004/0150093 A1 | * | 8/2004 | Pellizzer et al. ........ | 257/695 |
| 2006/0131693 A1 | * | 6/2006 | Kim .................... | 257/565 |
| 2006/0208277 A1 | * | 9/2006 | Casey .................. | 257/164 |

* cited by examiner

*Primary Examiner*—H. Jey Tsai
(74) *Attorney, Agent, or Firm*—Trop, Pruner & Hu, P.C.

(57) ABSTRACT

A plurality of bipolar transistors are formed by forming a common conduction region, a plurality of control regions extending each in an own active areas on the common conduction region, a plurality of silicide protection strips, and at least one control contact region. Silicide regions are formed on the second conduction regions and the control contact region. The second conduction regions may be formed by selectively implanting a first conductivity type dopant areas on a first side of selected silicide protection strips. The control contact region is formed by selectively implanting an opposite conductivity type dopant on a second side of the selected silicide protection strips.

6 Claims, 10 Drawing Sheets

SELF-ALIGNED BIPOLAR JUNCTION TRANSISTORS

BACKGROUND

This relates to a process for manufacturing fully self-aligned bipolar junction transistors embedded in a complementary metal oxide semiconductor (CMOS) flow. In particular, the present description refers to the manufacture of bipolar junction transistors operating as selection devices in a phase change memory.

As known, phase change memories are formed by memory cells connected at the intersections of bitlines and wordlines and comprising each a memory element and a selection element. A memory element comprises a phase change region made of a phase change material, i.e., a material that may be electrically switched between a generally amorphous and a generally crystalline state across the entire spectrum between completely amorphous and completely crystalline states.

Typical materials suitable for the phase change region of the memory elements include various chalcogenide elements. The state of the phase change materials is non-volatile, absent application of excess temperatures, such as those in excess of 150° C., for extended times. When the memory is set in either a crystalline, semi-crystalline, amorphous, or semi-amorphous state representing a resistance value, that value is retained until reprogrammed, even if power is removed.

Selection elements may be formed according to different technologies. For example, they can be implemented by diodes, metal oxide semiconductor (MOS) transistors or bipolar transistors.

DETAILED DESCRIPTION

Figure 1:
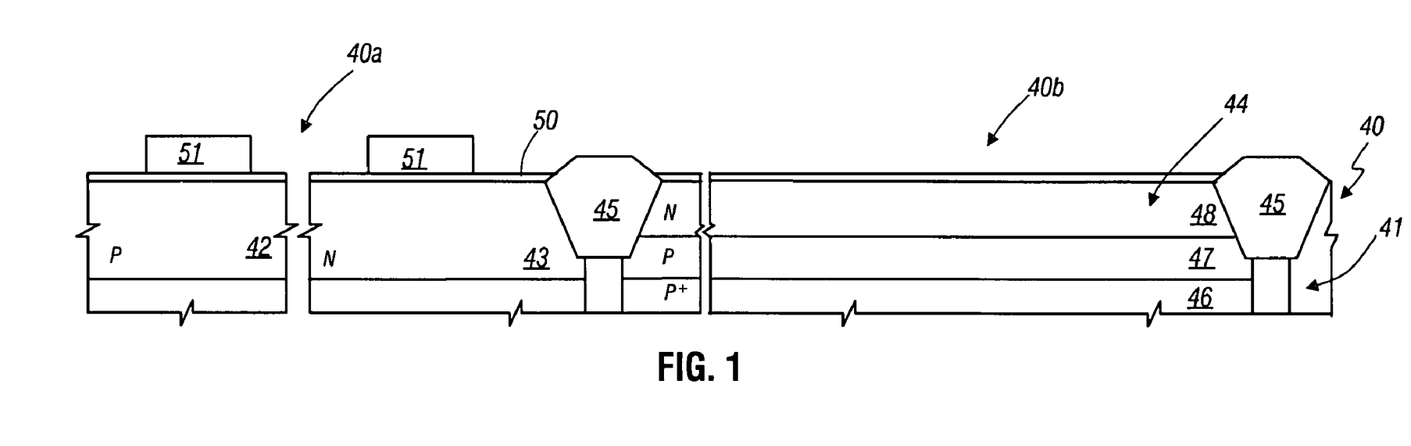
FIGS. 1 and 2 are enlarged cross-sections of a portion of a semiconductor body according to an embodiment of the present invention.

FIG. 1 shows a wafer 40 comprising a substrate 41 of silicon. In FIG. 1, the left-hand portion of the wafer 40 forms a circuitry portion 40a of a memory device, and the right-hand portion forms a matrix or periphery portion 40b.

In FIG. 1, the wafer 40 has already been processed with standard front-end steps, including defining active areas e.g. using the "shallow trench" technology; implanting buried P+-type subcollector regions in the matrix portion 40b; implanting N-wells and P-wells in the circuitry portion 40a; implanting collector regions in the matrix portion 40b; implanting N-type base regions in the matrix portion 40b; growing an oxide layer onto the entire surface of the substrate, as well as depositing and defining a polysilicon layer to form gate regions in the matrix portion.

Thus, according to FIG. 1, the substrate 41 accommodates, on the left, in circuitry portion 40a, P-wells 42 and N-wells 43 and, on the right, in matrix portion 40b, a plurality of active areas 44 (better visible from the top view of FIG. 3) insulated from each other (as well as from the circuitry portion) by field oxide regions 45 in one embodiment. Furthermore, the matrix portion 40b may accommodate a subcollector region 46, e.g. of P+ type, and a collector region 47, e.g. of P type, extending on the subcollector region 46. The subcollector region 46 and the collector region 47 may extend at least in part below the field oxide regions 45 and may be common to and shared by the entire matrix portion. Furthermore, each active area 44 accommodates its own base region 48, e.g. of N type, extending on the collector region 47. Thus, each active area 44 has its own base region 48, not shared with adjacent active areas 44 in some embodiments.

An oxide layer 50 covers the entire surface of the substrate 41 and gate regions 51 are formed in the circuitry portion 40a, on the oxide layer 50 in one embodiment.

Figure 2:
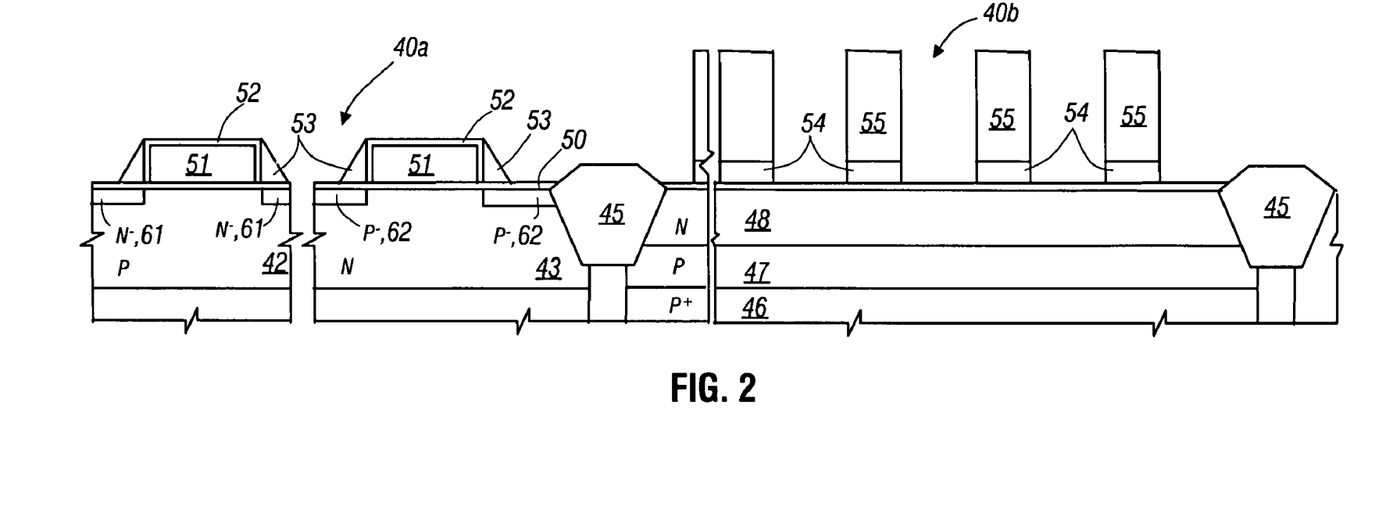

Then, in FIG. 2, a source and drain reoxidation step may be carried out, sealing the gate regions 51 with reoxidation regions 52. Lightly doped drain (LDD) implants are carried out for both P-channel and N-channel circuitry transistors in the circuitry portion 40a, to form N-type and P-type lightly doped regions, 61, 62 in one embodiment. During the implantation of the LDD regions, the matrix portion 40b and the areas of the circuitry portion 40a, intended to form transistors of the opposite channel-type, may be masked.

Thereafter, in one embodiment, a dielectric material (preferably nitride or a composite material such as ONO—Oxide/Nitride/Oxide) having a thickness of 80-100 nm may be deposited onto the whole wafer 40. A matrix transistor mask 55 may be formed on the matrix portion 40b and the dielectric material is etched, to form spacers 53 on the sides of the gate regions 51, in the circuitry portion 40a, and masking strips 54 on the matrix portion 40b.

Figure 3:
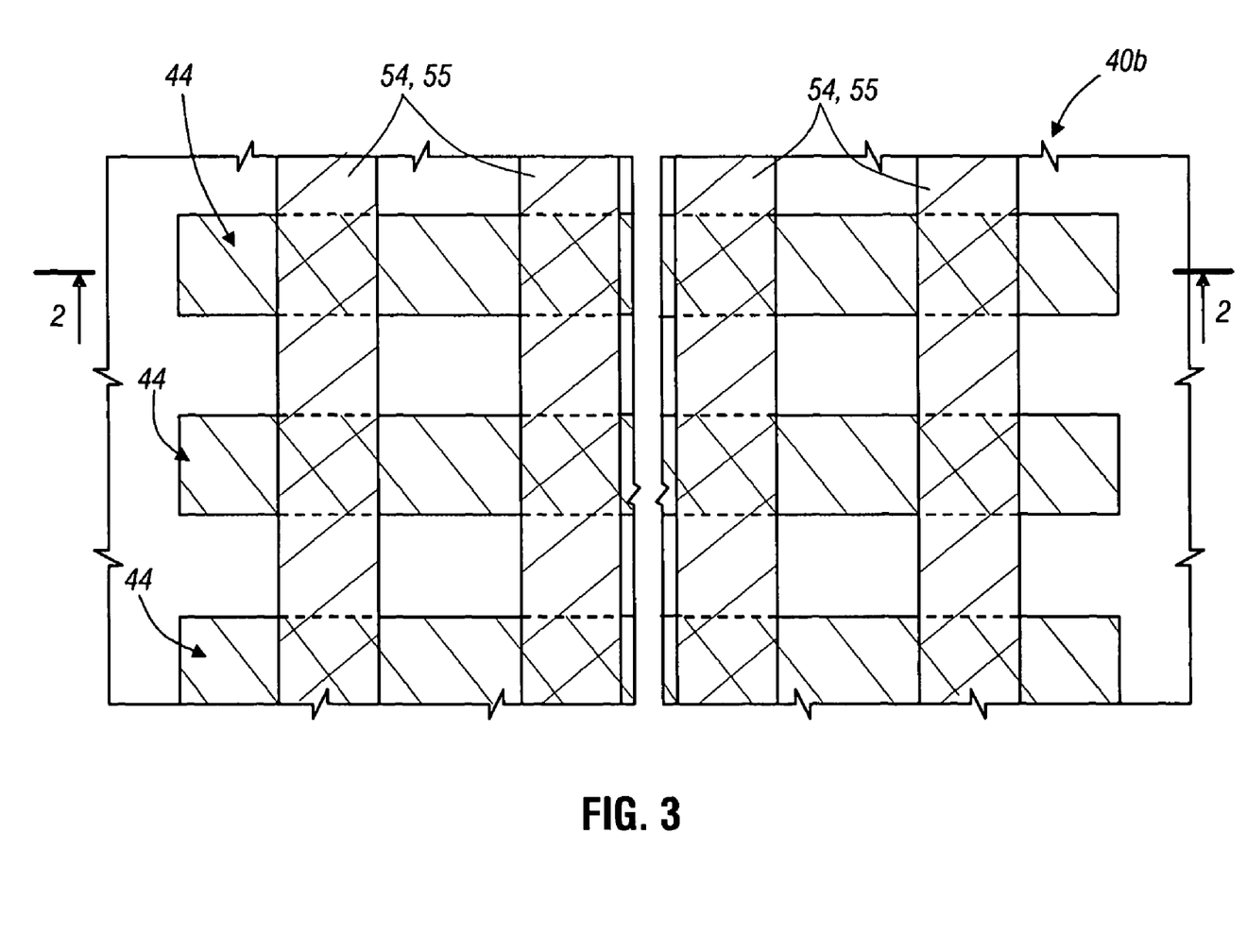
FIG. 3 is an enlarged top view of the device of FIG. 2.

As clearly visible from the top view of FIG. 3, the masking strips 54 extend transversely and specifically perpendicularly to the active areas 44. The masking strips 54 may have a width of 0.1 μm and may be spaced apart by a distance of 0.12 μm in one embodiment.

Figure 4:
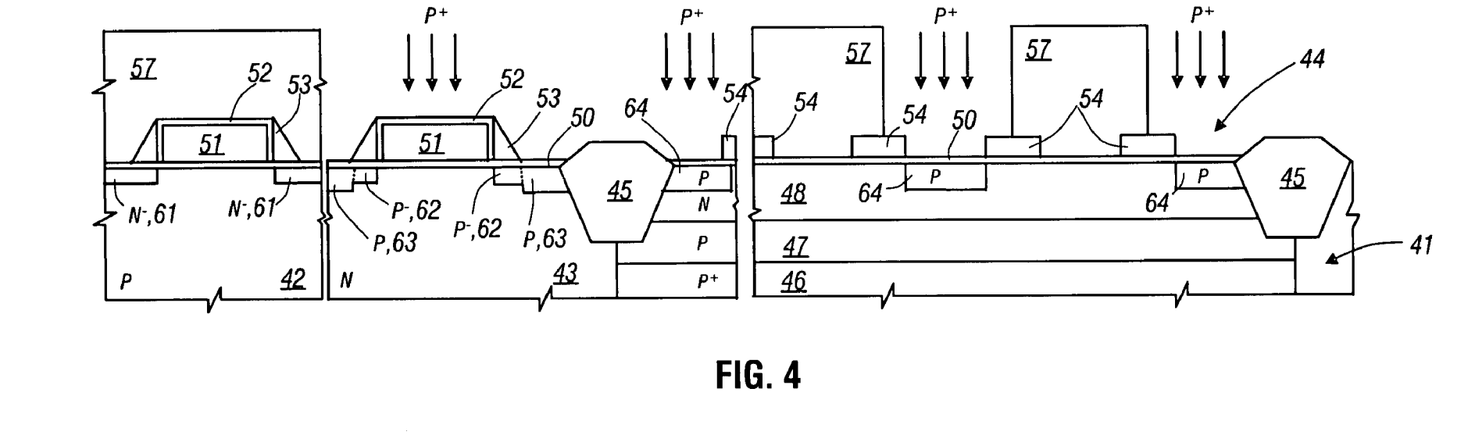
FIGS. 4-8 are enlarged cross-sections of the device of FIGS. 1-2, in subsequent manufacturing steps.
Figure 5:
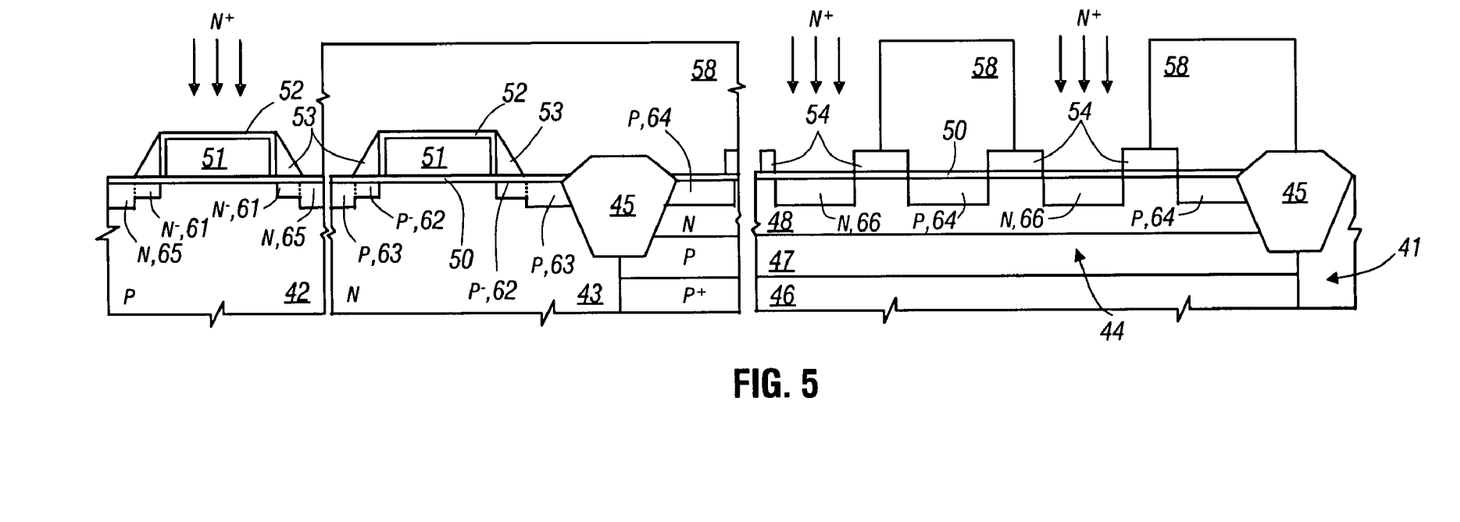

Then, source and drain regions for the circuitry transistors in the circuitry portion 40a and base contact and emitter regions for the selection transistors in the matrix portion 40b may be implanted, as indicated by arrows in FIGS. 4 and 5.

In FIG. 4, a P-implant protection mask 57 may be formed, which covers the areas of the circuitry portion 40a intended to form N-channel transistors and the areas of the matrix portion 40b which should not be implanted (where base contact regions are to be formed) with the P-type implant. Thus, the P-implant protection mask 57 has, on the matrix portion 40b, a strip-like shape, wherein each strip 57 extends to cover every other aperture comprised between two adjacent masking strips 54, as well as the two facing halves of such adjacent masking strips 54. Then a P+ implant (e.g., with boron) may be carried out, thereby forming source regions 63 of P-channel transistors in the circuitry portion 40a and emitter regions 64 in the matrix portion 40b.

As an alternative to the above, two separate masking steps and two separate implanting steps may be used, to distinctly implant the source regions 63 and the emitter regions 64.

Figure 6:
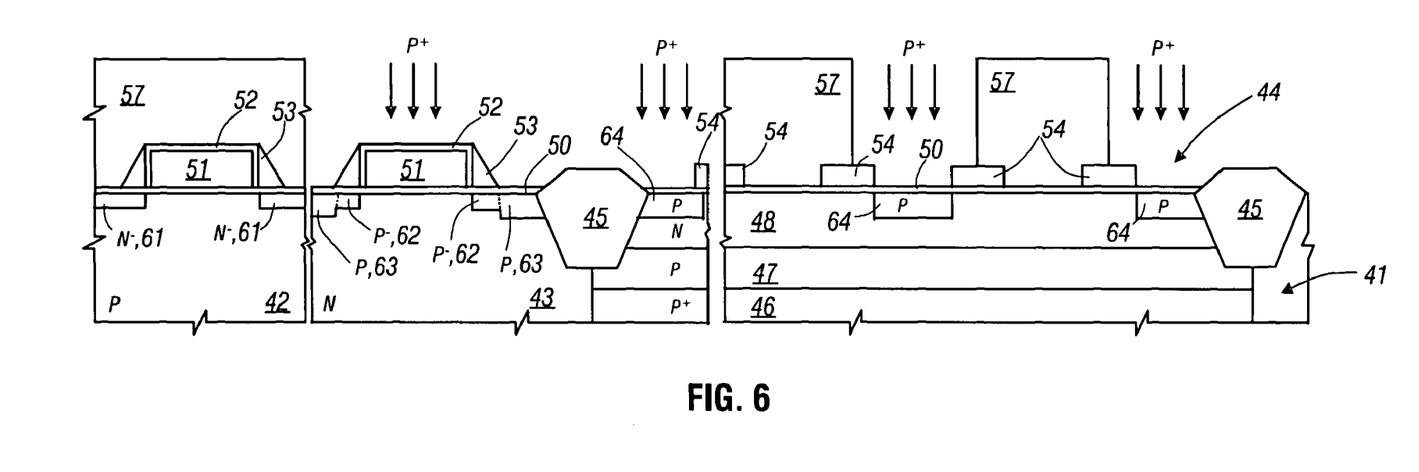

Then, in FIG. 5, after removing the P-implant protection mask 57, an N-implant protection mask 58 may be formed, which covers the areas of the circuitry portion 40a where N-channel transistors have been formed and the emitter regions 64. Referring to FIG. 6, an N+ implant (e.g., using arsenic) may be carried out, thereby forming source regions 65 of N-channel transistors in the circuitry portion 40a and base contact regions 66 in the matrix portion 40b. Accordingly, the base contact regions 66 are arranged alternately to the emitter regions 64 in each active area 44.

Figure 7:
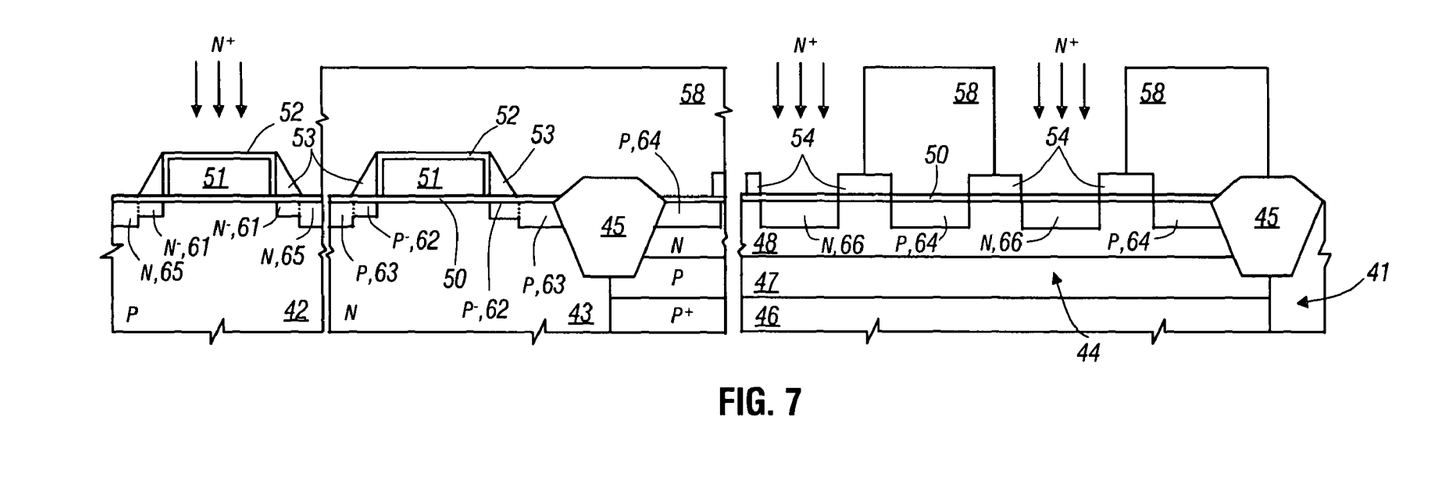

Thereafter, as shown in FIG. 7, the N-implant protection mask 58 may be removed and an implant activation/diffusion step may be performed using a Rapid Temperature Process (RTP) at a temperature between 900 and 1100° C. in one embodiment.

If N+ and P+ source regions 65 and drain regions 63 are implanted before the base contact regions 66 and the emitter regions 64, then two different RTPs can be used, thus separately optimizing the profile of these junctions.

Figure 8:
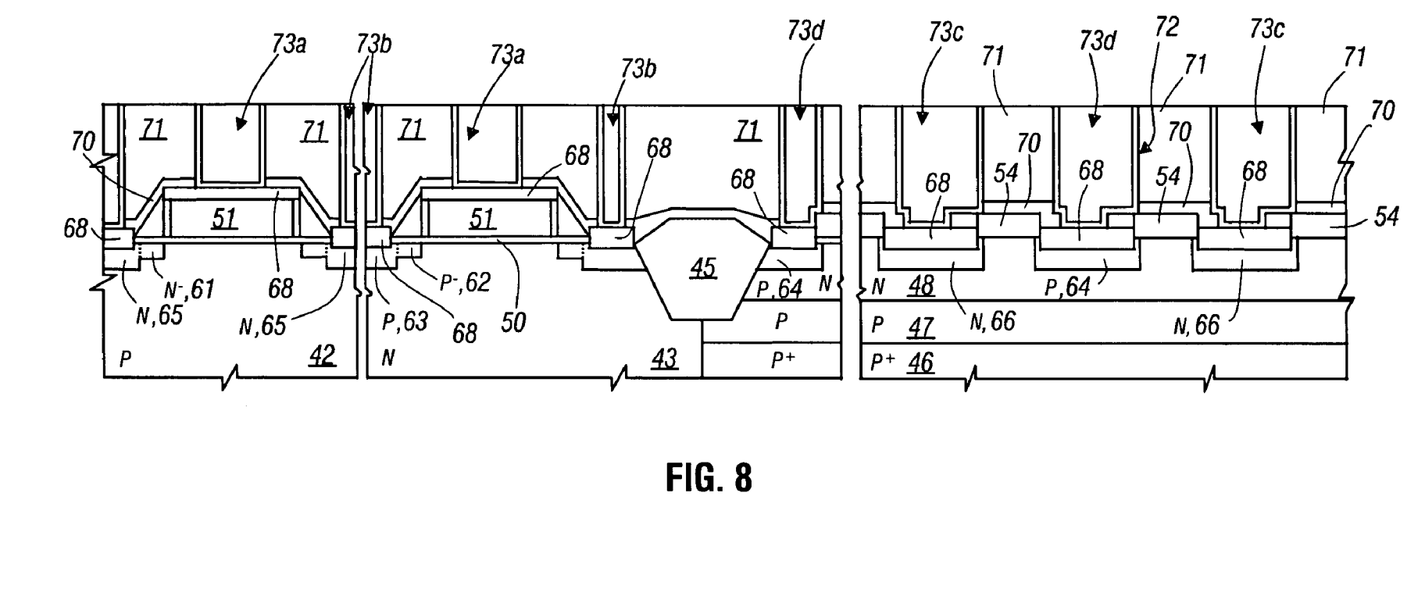

Referring to FIG. 8, the uncovered portions of the oxide layer 50 and the reoxidation regions 52 are etched, and salicide regions 68 may be grown over the gate regions 51, the source and drain regions 63, 65, the emitter regions 64 and the base contact regions 66. Thus, the salicide regions 68 are self-aligned with the masking strips 54 in one embodiment. The salicide on the emitter is centered on said emitter.

Then, a first nitride layer 70 (preferably, with a thickness of 20 nm) and a first dielectric layer 71 (preferably, USG—Undoped Silicate Glass—with a thickness of 700 nm) are deposited and planarized down to about 600 nm, in one embodiment.

Thereafter, the first dielectric layer 71 and the first nitride layer 70 are etched where contacts are to be formed so as to form openings 72 that reach the silicide regions 68 both in the circuitry portion 40a and in the matrix portion 40b. The apertures 72 may be filled by a barrier layer, e.g., multiple Ti/TiN layers, and by a tungsten layer, and the deposited layers may be planarized to form first level plugs 73a-73d. In particular, first level plugs 73a are in electrical contact with the gates 51, first level plugs 73b are in electrical contact with the source or drain regions of the CMOS transistors, first level plugs 73c are in electrical contact with the base contact regions 66 and first level plugs 73d are in electrical contact with the emitter regions 64.

Figure 9:
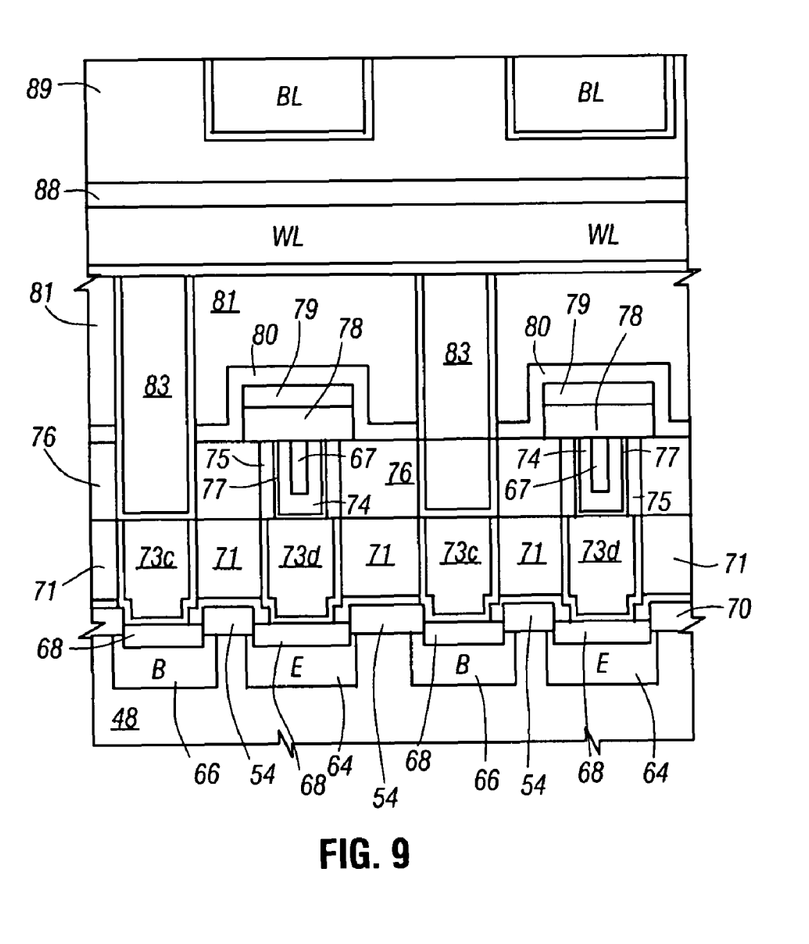
FIG. 9 is an enlarged cross-section of the matrix portion of the final device of FIGS. 1-8, taken along line 9-9 of FIG. 11.
Figure 10:
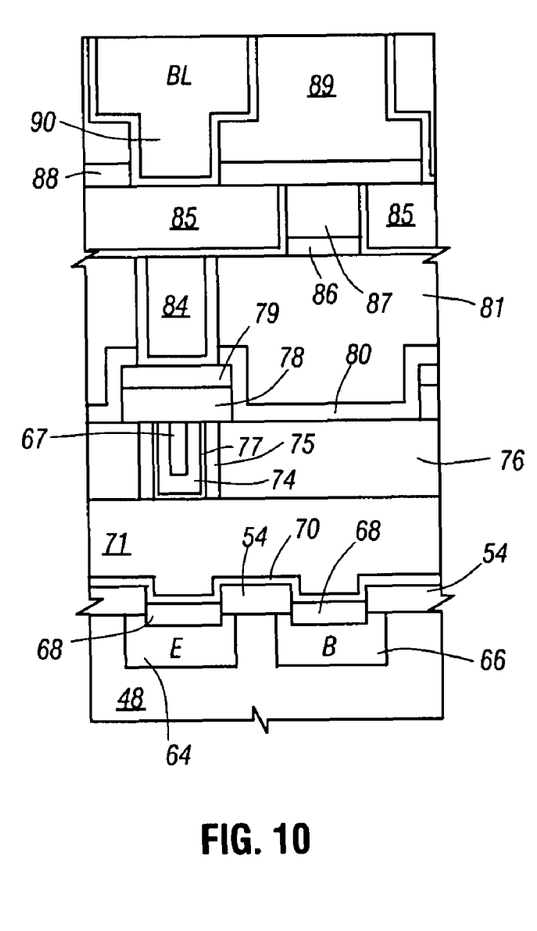
FIG. 10 is another enlarged cross-section of the matrix portion of the final device taken along line 10-10 of FIG. 11.
Figure 11:
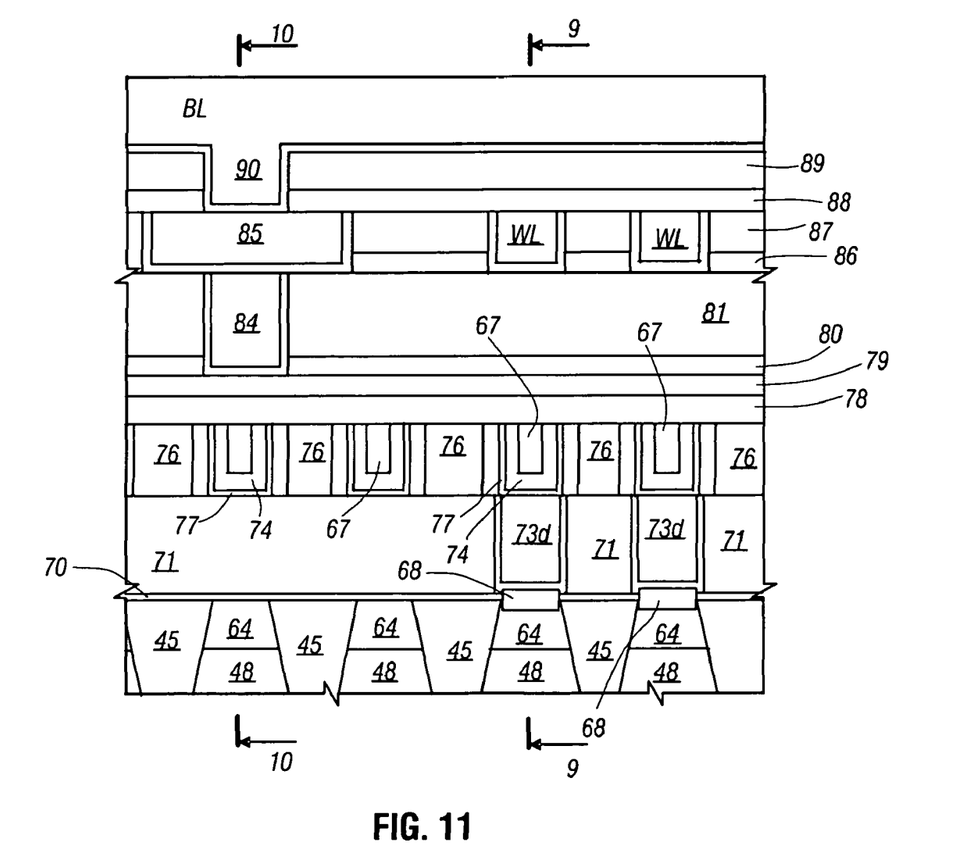
FIG. 11 is an enlarged cross-section taken along the direction of the bitlines.

Finally, the memory elements may be formed. FIG. 9 refers to the right-hand portion of FIG. 8 and is taken in the direction of the wordlines. FIG. 10 is taken along a plane parallel to the section plane of FIG. 9 and shows the portion of the memory device where strapping of the bit lines occurs. FIG. 11 is taken in the direction of the bitlines.

In detail, a second dielectric layer 76 is deposited; openings are formed in the second dielectric layer 76 above the emitter regions 64; a spacer layer 75 of silicon nitride is formed on the walls of the openings 22; a heater layer 77 and a sheath layer 74 are subsequently deposited to cover the walls and the bottom of the openings; a third dielectric layer 67 is deposited to fill the openings; and the wafer is planarized in one embodiment. Accordingly, the heaters 77 may be generally cup-shaped. In FIG. 9, the heaters 77 extend on a first-level plug 73d which is in electrical contact with an emitter region 64, while in the plane of FIG. 9, no first level plugs 73d extend below the heater 77.

Next, a chalcogenide layer 78 of GST ($Ge_2Sb_2Te_5$), and a metal layer 79 are deposited and defined to form resistive bit lines, which run perpendicularly to the plane of the sheet. Metal lines 79 thus create a first metal level.

Then, a sealing layer 80 and a fourth dielectric layer 81 are deposited; holes are opened, coated with a barrier layer and filled by a metal layer 83 or 84, of copper in one embodiment.

Thus, the cross-section of FIG. 9 shows second level base plugs 83 which extend through the layers 76, 80 and 81 to contact the first level plug 73c. The portion of FIGS. 10 and 11 show second level intermediate plugs 84 extending through the layers 80 and 81 to contact the first metal layer 79 in one embodiment.

Then, wordlines WL, from a second metal layer, are formed on the fourth dielectric layer 81 in electrical contact with the second level, base plugs 83 and thus the base regions 48, through the first level plugs 73c and the base contact regions 66, as shown in the cross-section of FIG. 9. Conductive regions 85 are formed from the same second metal layer as the wordline WL, as visible from FIG. 11, in electrical contact with the second level, intermediate plugs 84 to allow electrical connections between the latter and bit-lines BL in one embodiment.

The wordlines WL and the conductive regions 85 are insulated from each other by a second nitride layer 86 and a fifth dielectric layer 87 (FIGS. 10 and 11).

A third nitride layer 88 and a sixth dielectric layer 89 may be formed on the fifth dielectric layer 87, the wordlines WL and the conductive regions 85; the bit lines BL are formed in the sixth dielectric layer 89 from a third metal layer; and vias 90 connect the bitlines BL to the conductive regions 85 in one embodiment.

Advantages of some embodiments are clear from the above description. In particular, some embodiments may be insensitive to misalignment between the emitter and base implant masks and the active areas; in fact, as immediately visible from FIGS. 3-5, the implant area is defined mainly by the masking strips 54, whose misalignment does not affect the dimensions of the emitter regions 64 and of the base contact regions 66; any limited misalignments of the emitter and base implant masks (P- and N-implant protection masks 57, 58) are generally irrelevant, due to the presence of the masking strips 54.

The presence of silicon protection regions (masking strips 54) may allow silicidation of the emitter and base contact regions 64, 66 in a simple and reliable way, and may enable a self-aligned structure, wherein the silicided regions 68 are fully aligned with the implanted regions 63-66 in some embodiments.

The presence of silicided regions 68 on the emitter regions 64 may reduce defects due to a direct contact between a metallic layer and the emitter regions 64, and no need may exist for cumbersome dual shallow trench isolations. The whole process may involve the reduction in the number of required masks, and thus in the manufacturing costs in some implementations.

In particular, the same flow may be used for forming any type of memory devices requiring a selector to access the memory element, and also for forming bipolar transistors outside the memory array, in both digital and analog devices. Moreover, the bipolar transistor forming the selection elements may be also of the dual type, that is of NPN type.

Figure 12:
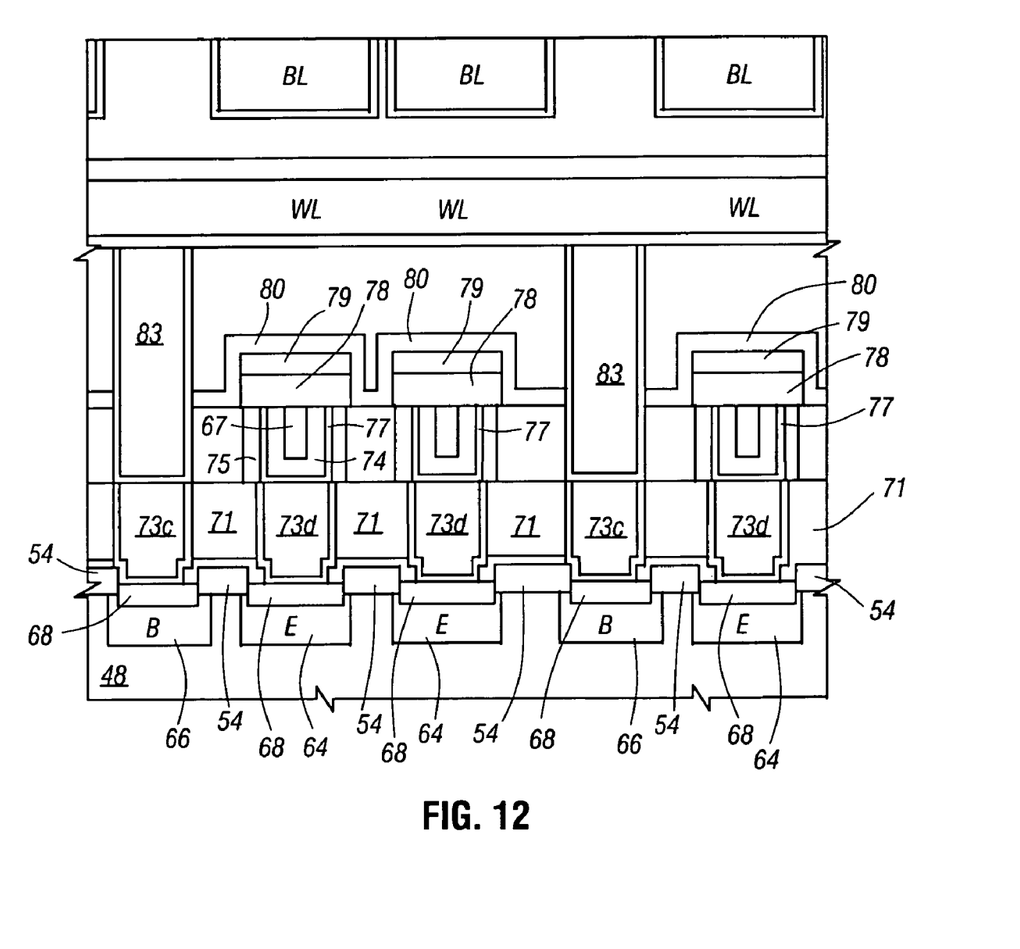
FIGS. 12 and 13 are enlarged cross-sections of the matrix portion of the final device, according to two different embodiments.
Figure 13:
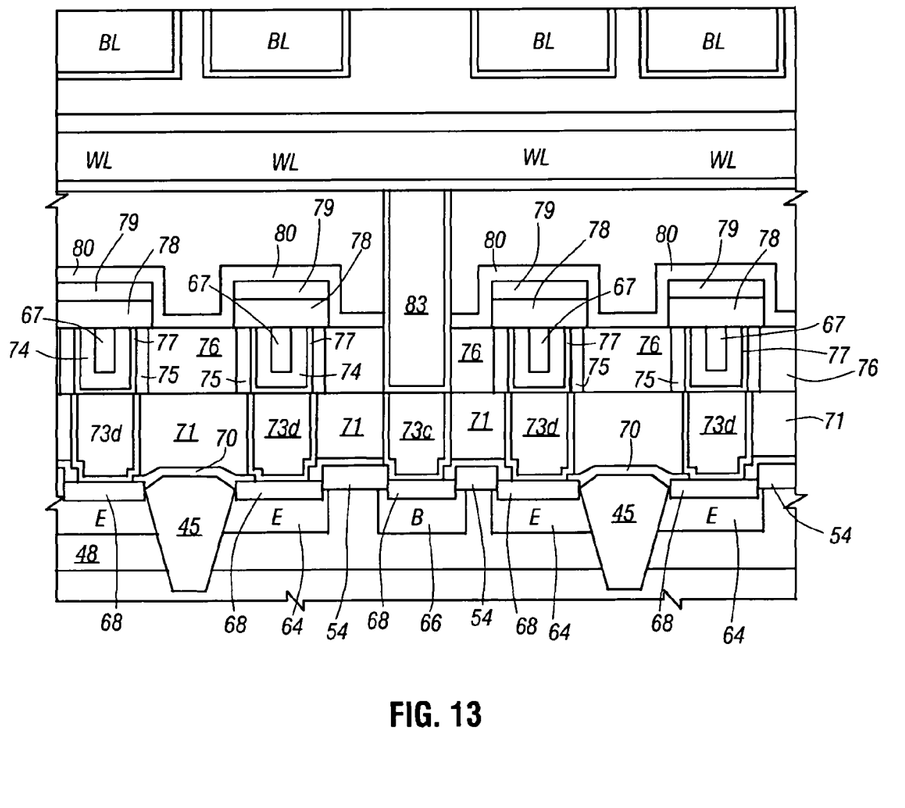

In addition, the succession of the emitter regions and the base contact regions may vary from the layout as shown, for example, as shown in FIG. 12, wherein a base contact region 66 is shared by two adjacent bipolar transistors, and FIG. 13, wherein field oxide regions 45 delimit active areas 44 accommodating each only two bipolar transistors, and the two bipolar transistors share the same base contact region 66.

Figure 14:
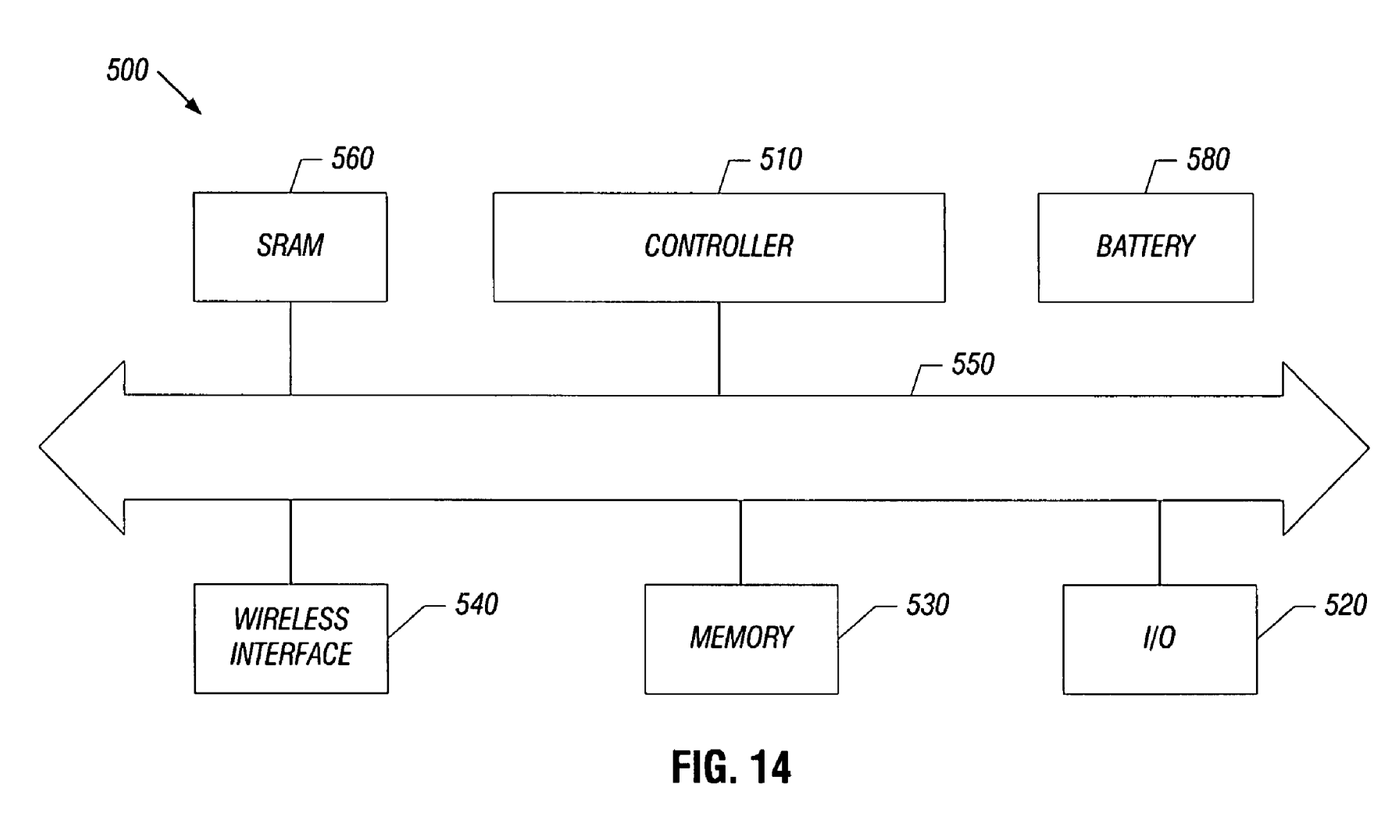
FIG. 14 is a system depiction for one embodiment.

Turning to FIG. 14, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly.

System 500 may be used in any of the following systems: a wireless local area network (WLAN) system, a wireless personal area network (WPAN) system, or a cellular network, although the scope of the present invention is not limited in this respect.

System 500 may include a controller 510, an input/output (I/O) device 520 (e.g. a keypad, display), a memory 530, a wireless interface 540, a digital camera 555, and a static random access memory (SRAM) 560 and coupled to each other via a bus 550. A battery 580 may supply power to the system 500 in one embodiment. It should be noted that the scope of the present invention is not limited to embodiments having any or all of these components.

Controller 510 may comprise, for example, one or more microprocessors, digital signal processors, micro-controllers, or the like. Memory 530 may be used to store messages transmitted to or by system 500. Memory 530 may also optionally be used to store instructions that are executed by controller 510 during the operation of system 500, and may be used to store user data. Memory 530 may be provided by one or more different types of memory. For example, memory 530 may comprise a volatile memory (any type of random access memory), a non-volatile memory such as a flash memory, and/or memories illustrated in FIG. 12 or 13.

The I/O device 520 may be used to generate a message. The system 500 may use the wireless interface 540 to transmit and receive messages to and from a wireless communication network with a radio frequency (RF) signal. Examples of the wireless interface 540 may include an antenna, or a wireless transceiver, such as a dipole antenna, although the scope of the present invention is not limited in this respect. Also, the I/O device 520 may deliver a voltage reflecting what is stored as either a digital output (if digital information was stored), or it may be analog information (if analog information was stored).

While an example in a wireless application is provided above, embodiments of the present invention may also be used in non-wireless applications as well.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
    forming bitlines extending in a first direction;
    forming an etch mask that defines openings for implanting a base contact, an emitter, and a source of a field effect transistor; and
    using said mask to form silicide on said source, said emitter, and said base contact, said silicide on said emitter being centered on said emitter in the first direction.

2. The method of claim 1 including using said mask to define an opening for said source by forming a sidewall spacer on a gate electrode.

3. The method of claim 1 including forming a plurality of bipolar transistors, said bipolar transistors having a common collector.

4. The method of claim 1 including forming said mask for emitter and base contact implants such that the emitter and base contact implants do not need to be aligned.

5. The method of claim 1 including forming a silicide over said emitter, source, and base contact.

6. The method of claim 5 wherein said silicide over said emitter, base, contact, and source is aligned by way of said etched mask.

* * * * *